US010088531B2

(12) United States Patent
Kuroiwa (10) Patent No.: US 10,088,531 B2
(45) Date of Patent: Oct. 2, 2018

(54) FAILURE DIAGNOSIS DEVICE AND FAILURE DIAGNOSIS METHOD FOR INVERTER (71) Applicant: HITACHI AUTOMOTIVE SYSTEMS, LTD., Hitachinaka-shi, Ibaraki (JP)

(72) Inventor: Nobuyuki Kuroiwa, Isesaki (JP)

(73) Assignee: HITACHI AUTOMOTIVE SYSTEMS, LTD., Hitachinaka-Shi (JP)

(*) Notice: Subject to any disclaimer, the term of this patent is extended or adjusted under 35 U.S.C. 154(b) by 74 days.

(21) Appl. No.: 15/059,406

(22) Filed: Mar. 3, 2016

(65) Prior Publication Data
US 2016/0261220 A1 Sep. 8, 2016

(30) Foreign Application Priority Data

Mar. 6, 2015 (JP) ................. 2015-045096

(51) Int. Cl.
G01R 31/42 (2006.01)
G01R 31/34 (2006.01)
H02P 6/08 (2016.01)
H02P 29/024 (2016.01)

(52) U.S. Cl.
CPC .............. G01R 31/42 (2013.01); H02P 6/085 (2013.01); H02P 29/0241 (2016.02); G01R 31/34 (2013.01)

(58) Field of Classification Search
CPC ....... H02P 29/024; H02P 6/085; G01R 31/42; G01R 31/34

USPC ...................................... 318/400.27
See application file for complete search history.

(56) References Cited

U.S. PATENT DOCUMENTS

| 4,903,187 A * | 2/1990 | Doi ..................... H02M 7/5395 363/37 |
| 7,583,523 B2 * | 9/2009 | Goto .................. B60H 1/00428 363/132 |
| 7,688,018 B2 * | 3/2010 | Goto ........................ H02P 6/14 318/432 |
| 8,410,740 B2 | 4/2013 | Suzuki |

(Continued)

FOREIGN PATENT DOCUMENTS

JP 2006-081327 A 3/2006
JP 2006-246564 9/2006
(Continued)

Primary Examiner — Eduardo Colon Santana
Assistant Examiner — Devon Joseph
(74) Attorney, Agent, or Firm — Foley & Lardner LLP (57) ABSTRACT A control unit of an inverter for driving a three-phase motor receives a voltage of a connection point from a circuit, in which the connection point interconnecting one end of each of three first resistors is connected to the ground through a second resistor, and the other end of each of the three first resistors is connected to each phase. The control unit diagnoses whether the inverter has incurred a failure based on the voltage of the connection point, the voltage being detected when a first switch provided on a positive bus is turned off, a second switch provided in parallel with the first switch and in series with a third resistor is turned on, a third switch provided in series with a fourth resistor between the power source and the connection point is turned on, and the switching elements are turned on or off according to a predetermined pattern.

8 Claims, 7 Drawing Sheets (56) References Cited

U.S. PATENT DOCUMENTS

| | | | |
|---|---|---|---|
| 8,922,152 B2* | 12/2014 | Kawamura | H03K 17/0828 180/65.21 |
| 2005/0029975 A1* | 2/2005 | Carson | G01K 7/42 318/432 |
| 2009/0051307 A1* | 2/2009 | Katsuyama | H02M 1/32 318/472 |
| 2010/0012408 A1* | 1/2010 | Takasaki | B60K 6/445 180/65.25 |
| 2011/0181217 A1* | 7/2011 | Vollmer | G01K 7/42 318/400.21 |

FOREIGN PATENT DOCUMENTS

| | | |
|---|---|---|
| JP | 2010-233343 | 10/2010 |
| JP | 2012-039740 | 2/2012 |

\* cited by examiner

| SWITCH | SETTING SIGNAL | |
| --- | --- | --- |
| | NORMAL MODE | FAILURE DIAGNOSIS MODE |
| SW1 | ON | OFF |
| SW2 | OFF | ON |
| SW3 | OFF | ON |

FIG. 5

SETTING FOR FIRST DIAGNOSIS

| SWITCHING ELEMENT | GATE CONTROL SIGNAL |
|---|---|
| 32u | OFF |
| 32v | OFF |
| 32w | OFF |
| 34u | OFF |
| 34v | OFF |
| 34w | OFF |

FIG. 6

SETTING FOR SECOND DIAGNOSIS

| SWITCHING ELEMENT | GATE CONTROL SIGNAL | | |
|---|---|---|---|
| | PATTERN 1A | PATTERN 2A | PATTERN 3A |
| 32u | OFF | OFF | OFF |
| 32v | OFF | OFF | OFF |
| 32w | OFF | OFF | OFF |
| 34u | ON | OFF | OFF |
| 34v | OFF | ON | OFF |
| 34w | OFF | OFF | ON |

FIG. 7

SETTING FOR THIRD DIAGNOSIS

| SWITCHING ELEMENT | GATE CONTROL SIGNAL | | |
|---|---|---|---|
| | PATTERN 1B | PATTERN 2B | PATTERN 3B |
| 32u | ON | OFF | OFF |
| 32v | OFF | ON | OFF |
| 32w | OFF | OFF | ON |
| 34u | OFF | OFF | OFF |
| 34v | OFF | OFF | OFF |
| 34w | OFF | OFF | OFF |

FAILURE DIAGNOSIS DEVICE AND FAILURE DIAGNOSIS METHOD FOR INVERTER

BACKGROUND OF THE INVENTION

1. Field of the Invention

The present invention relates to a failure diagnosis device and a failure diagnosis method for an inverter which are adapted to diagnose whether a failure has occurred in an inverter that drives a motor.

2. Description of Related Art

As a conventional failure diagnosis device and a conventional failure diagnosis method for an inverter, there has been known a technique whereby to diagnose a failure of an inverter on the basis of a resultant voltage obtained by combining the output voltage of each phase of the inverter, which is taken as the voltage of a virtual neutral point corresponding to the neutral point of a motor when switching elements of the inverter are PWM driven (e.g. refer to Japanese Patent Application Laid-Open No. 2006-81327). According to the technique, the output voltage of each phase of the inverter has a rectangular wave shape, so that a signal of the resultant voltage is passed through a low-pass filter, the cutoff frequency of which is lower than a PWM carrier frequency, thereby to extract a DC component from the signal of the resultant voltage, and the value of the DC component is used to diagnose whether a failure has occurred in the inverter.

Inconveniently, however, there is a time delay until the signal of the resultant voltage which has passed through the filter converges to a certain level. Hence, if an ON-fixed fault occurs in at least one of switching elements on an upper arm side and switching elements on a lower side, then an excessive short-circuit current may be generated between a power source and the ground through the inverter until it is at least diagnosed that a failure has occurred in the inverter. This may induce the occurrence of a secondary failure in the entire inverter.

SUMMARY OF THE INVENTION

Therefore, an object of the present invention is to provide a failure diagnosis device and a failure diagnosis method for an inverter which are adapted to suppress the occurrence of an excessive short-circuit current between a power source and the ground through an inverter when diagnosing a failure of the inverter.

According to one aspect of the present invention, there is provided a failure diagnosis device for an inverter adapted to diagnose whether a failure has occurred in an inverter in which a pair of switching elements connected in series constitutes an upper arm and a lower arm in each phase to drive a three-phase motor, the failure diagnosis device including: a voltage detection circuit in which a connection point interconnecting one end of each of three first resistors is connected to a ground through a second resistor, and the other end of each of the three first resistors is connected in a one-to-one manner between the upper arm and the lower arm of each phase so as to detect a voltage of the connection point; a first switch provided on a positive bus which connects a power source and the switching elements on the upper arm side; a second switch provided in parallel with the first switch and in series with a third resistor; a third switch provided in series with a fourth resistor between the power source and the connection point; and a control unit which is configured to control turning on/off of the switching elements on the upper arm side, the switching elements on the lower arm side, the first switch, the second switch, and the third switch, and which is electrically connected to the connection point.

According to another aspect of the present invention, there is provided a failure diagnosis method for an inverter adapted to diagnose whether a failure has occurred in an inverter in which a pair of switching elements connected in series constitutes an upper arm and a lower arm in each phase to drive a three-phase motor, wherein a control unit of the inverter: receives a voltage of a connection point from a circuit in which the connection point interconnecting one end of each of three first resistors is connected to a ground through a second resistor and the other end of each of the three first resistors is connected in a one-to-one manner between the upper arm and the lower arm of each phase; and diagnoses whether the inverter has incurred a failure on the basis of the voltage of the connection point, the voltage being detected at the time of turning off a first switch provided on a positive bus connecting a power source and the switching elements on the upper arm side, turning on a second switch provided in parallel with the first switch and in series with a third resistor, turning on a third switch provided in series with a fourth resistor between the power source and the connection point, and performing control to turn on or off the switching elements on the upper arm side and the switching elements on the lower arm side according to a predetermined pattern.

Other objects and features of aspects of the present invention will be understood from the following description with reference to the accompanying drawings.

DESCRIPTION OF PREFERRED EMBODIMENTS

Figure 1:
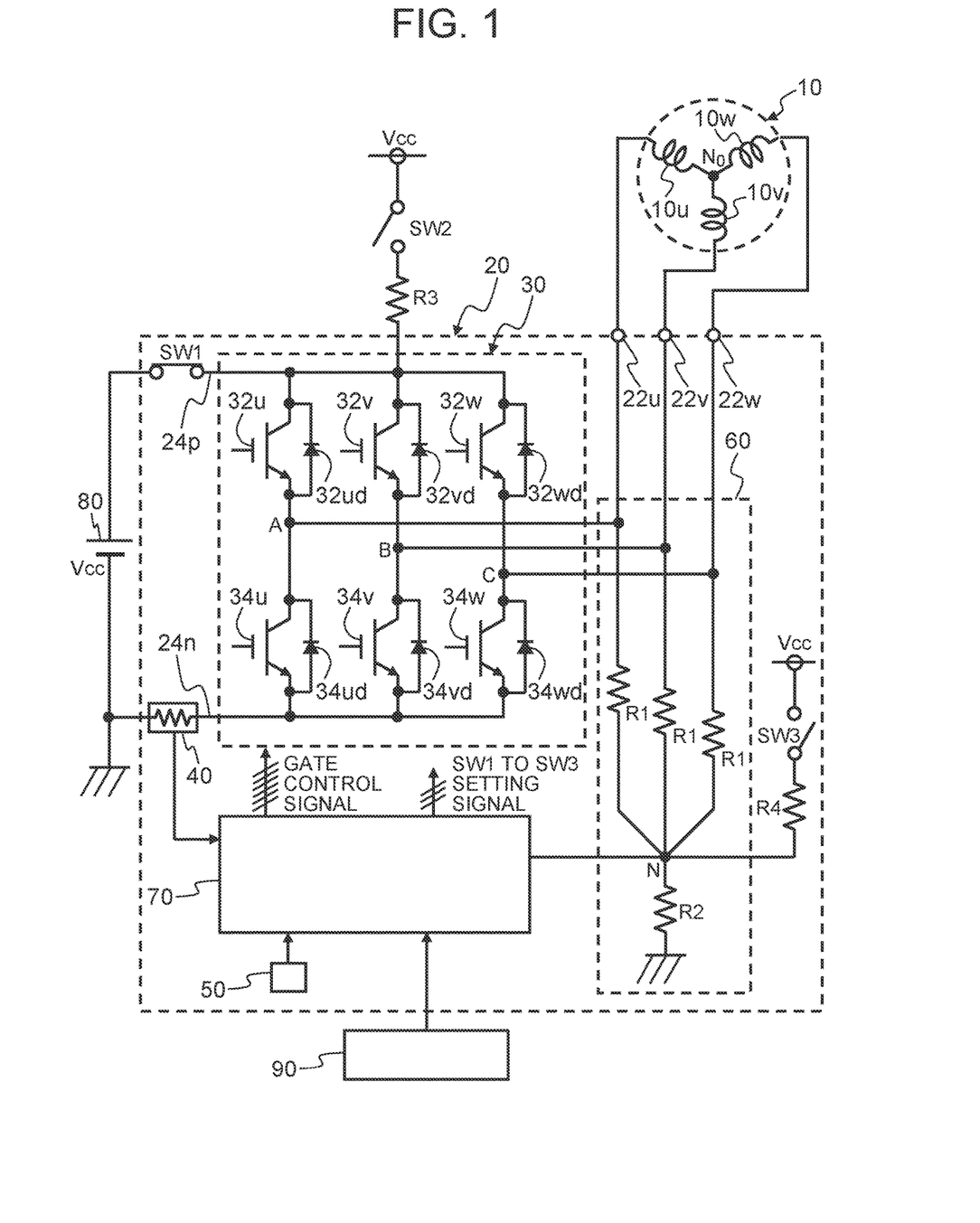
FIG. 1 is a diagram illustrating an exemplary circuit configuration of a drive controller of a brushless motor to which a failure diagnosis device for an inverter according to an embodiment of the present invention is applied.

FIG. 1 is a diagram illustrating an exemplary circuit configuration of a drive controller of a brushless motor to which a failure diagnosis device for an inverter according to an embodiment of the present invention is applied.

A brushless motor 10 is a three-phase DC synchronous motor. The brushless motor 10 has coils $10u$, $10v$ and $10w$ of three phases, namely, a U-phase, a V-phase and a W-phase, the coils being provided on a cylindrical stator (not illustrated), and configuring a star connection having a neutral point $N_0$ formed by interconnecting one end of each of the coils $10u$, $10v$ and $10w$ of the individual phases. Further, a rotor, which is a permanent magnet rotor (not illustrated) is rotatably provided in a space formed at the central part of the stator.

The brushless motor 10 in the present embodiment is expected to be applied to an electric actuator of an in-vehicle electric brake which directly generates a hydraulic pressure in a brake master cylinder by using a ball screw; however, the application examples are not limited thereto. The brushless motor 10 can be applied to any in-vehicle system electric actuators, such as a valve timing control (VTC), a variable compression ratio (VCR) device, an electric oil pump, an electric water pump, an electric power steering, and a radiator fan.

A drive controller 20 which is electrically and detachably connected to the other ends of the coils $10u$, $10v$ and $10w$ of the three phases of the brushless motor 10 at terminals $22u$, $22v$ and $22w$ includes an inverter 30 having a drive circuit which drives the brushless motor 10, a current sensor 40 which detects a current flowing to the brushless motor 10, a magnetic pole position detection sensor 50 which detects the magnetic pole position of the rotor, a voltage detection circuit 60 for detecting the voltage of a virtual neutral point N corresponding to the neutral point $N_0$ of the brushless motor 10, a first switch SW1, a second switch SW2, a third switch SW3, and a control unit 70 serving as a control means which controls the inverter 30.

The inverter 30 has a group of switching elements, in which switching elements $32u$, $32v$, $32w$ and $34u$, $34v$, $34w$ are in three-phase bridge connection. A voltage Vcc is supplied to the group of the switching elements from a power source 80. More specifically, the inverter 30 is configured by a pair of switching elements $32u$ and $34u$ connected in series, which form the upper arm and the lower arm, respectively, in the U-phase, a pair of switching elements $32v$ and $34v$ connected in series, which form the upper arm and the lower arm, respectively, in the V-phase, and a pair of switching elements $32w$ and $34w$ connected in series, which form the upper arm and the lower arm, respectively, in the W-phase. The upper arms are composed of the switching elements $32u$, $32v$ and $32w$ on the upper arm side, which is a high potential side, and the lower arms are composed of the switching elements $34u$, $34v$ and $34w$ on the lower arm side, which is a low potential side. Further, a point A between the upper and the lower arms of the U-phase is connected with the terminal $22u$, a point B between the upper and the lower arms of the V-phase is connected with the terminal $22v$, and a point C between the upper and the lower arms of the W-phase is connected with the terminal $22w$.

In the inverter 30, the switching elements $32u$, $32v$, $32w$, $34u$, $34v$ and $34w$ are composed of semiconductor elements, such as field effect transistors (FETs), insulated gate bipolar transistors (IGBTs), or bipolar transistors, which are capable of performing switching operations. The switching elements include diodes $32ud$, $32vd$, $32wd$, $34ud$, $34vd$ and $34wd$, which are in antiparallel connection to return a surge current attributable to a back electromotive force. The control terminals (gate terminals) of the switching elements $32u$, $32v$, $32w$, $34u$, $34v$ and $34w$ are connected to the control unit 70 and configured to be turned on or off in response to gate control signals received from the control unit 70, as will be discussed hereinafter.

The current sensor 40 is a shunt resistance type sensor which detects the current flowing to the brushless motor 10 by providing a resistor in series on a negative bus $24n$ on the low potential side, a positive bus $24p$ and the negative bus $24n$ connecting the inverter 30 and a power source 80. A signal corresponding to a difference in potential between both ends of the current sensor 40 is output to the control unit 70.

For the magnetic pole position detection sensor 50, various types of sensors (a contact type or a noncontact type) may be used, including a resolver, a Hall element, a Hall IC, a magnetoresistance element, and a rotary encoder. The magnetic pole position detection sensor 50 outputs a magnetic pole position detection signal based on the magnetic pole position of the rotating rotor of the brushless motor 10 to the control unit 70.

The voltage detection circuit 60 is constituted by interconnecting one end of each of three first resistors R1 and connecting a connection point thereof to the ground through the intermediary of a second resistor R2, and connecting the other end of each of the three first resistors R1 to the point A between the upper and the lower arms of the U-phase, the point B between the upper and the lower arms of the V-phase, and the point C between the upper and the lower arms of the W-phase in a one-to-one manner. The voltage detection circuit 60 is provided for detecting the voltage of the connection point as the voltage of the virtual neutral point N that corresponds to the neutral point $N_0$ of the brushless motor 10. The virtual neutral point N is connected to the control unit 70. The first resistors R1 and the second resistor R2 have resistance values that are sufficiently larger than that of the current sensor 40.

The first switch SW1, the second switch SW2 and the third switch SW3 are composed of switching elements, such as transistors and electromagnetic relays, which are configured to be controlled to turn on or off in response to control signals received from outside.

The positive bus $24p$ and the negative bus $24n$ connect the inverter 30 and the power source 80. The first switch SW1 is provided on the positive bus $24p$ on the high potential side, the second switch SW2 is provided in parallel with the first switch SW1 and in series with the third resistor R3 on a line connecting the inverter 30 and the power source 80 in parallel to the positive bus $24p$, and the third switch SW3 is provided in series with a fourth resistor R4 between the power source 80 and the virtual neutral point N.

The third resistor R3 and the fourth resistor R4 both have resistance values that are sufficiently larger than that of the current sensor 40. The third resistor R3 in particular has a resistance value that causes the voltage applied to the inverter 30 to decrease from Vcc so as to suppress a second failure attributable to the overheating of the inverter 30 in the case where the ON-fixed fault occurs in both the upper and the lower arms, causing an short-circuit current to flow between the power source 80 and the ground through the intermediary of the second switch SW2 and the inverter 30.

The control unit 70 has a microcomputer, which includes a central processing unit (CPU), a read only memory (ROM), a random access memory (RAM) and the like, and receives detection signals of the voltages at both ends of the current sensor 40, the magnetic pole position signals from the magnetic pole position detection sensor 50, detection signals of the voltage of the virtual neutral point N of the voltage detection circuit 60, and the drive request signals to the brushless motor 10 output from an external controller 90, such as a controller of a higher order in, for example, an electric brake system. Based on an information on the received signals, the control unit 70 individually outputs gate control signals to the switching elements $32u$, $32v$, $32w$,

34*u*, 34*v* and 34*w* of the inverter 30 to turn on or off the switching elements, and also individually outputs setting signals to the switches SW1, SW2 and SW3 to turn on or off the switches. Thus, the control unit 70 constitutes a control unit of the drive controller 20 to carry out the control for rotatively driving the rotor of the brushless motor 10 in a normal operation mode and also to diagnose, at a predetermined timing, whether a failure has occurred in the inverter 30.

Figure 2:
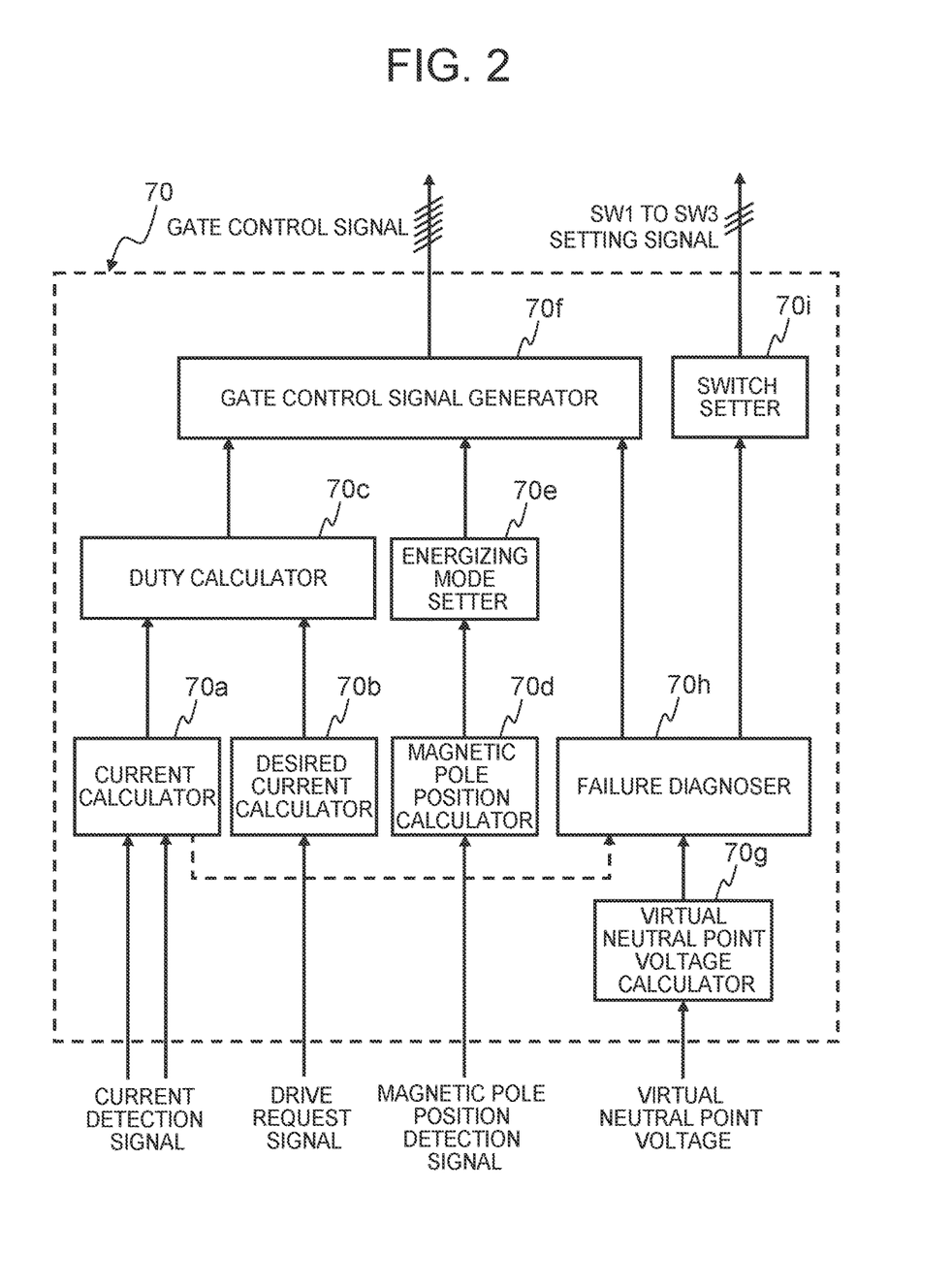
FIG. 2 is a function block diagram illustrating the functions of a control unit in the drive controller illustrated in FIG. 1.

FIG. 2 is a function block diagram illustrating the functions of the control unit 70.

The control unit 70 has functions represented by a current calculator 70*a*, a desired current calculator 70*b*, a duty calculator 70*c*, a magnetic pole position calculator 70*d*, an energizing mode setter 70*e*, a gate control signal generator 70*f*, a virtual neutral point voltage calculator 70*g*, a failure diagnoser 70*h*, and a switch setter 70*i*.

The current calculator 70*a* performs A/D conversion on the voltages (the current detection signals) at both ends of the current sensor 40 to calculate the potential difference between the two voltages, and calculates an actual current value of the current that actually flows to the brushless motor 10 on the basis of the potential difference and a known resistance value of the current sensor 40. Regarding the voltages at both ends of the current sensor 40, the potential difference determined through a differential amplifier may be input to the current calculator 70*a*.

The desired current calculator 70*b* receives a drive request signal on an output required of the brushless motor 10, such as a torque required of the brushless motor 10 necessary for, e.g. a brake pedal pressure, from the external controller 90, and calculates a desired current value, which is a desired value of a current to be supplied to the brushless motor 10, according to the drive request signal.

Based on a difference between the actual current value and the desired current value, the duty calculator 70*c* calculates a duty (%) of the pulse width modulation (PWM) signal for turning on or off the switching elements 32*u*, 32*v*, 32*w*, 34*u*, 34*v* and 34*w* to generate a gate control signal in the gate control signal generator 70*f*. The duty can be calculated according to the following expression by, for example, the proportional-integral control (PI control) based on the difference between the actual current value and the desired current value.

Current difference $\Delta I$=Desired current value−Actual current value

Duty=($\Delta I$×Proportional gain+Integrated gain of $\Delta I$×Integrated gain)/Supply voltage×100

The arithmetic processing of the duty is not limited to the proportional-integral control and may be carried out using a publicly known arithmetic processing method, such as the proportional-integral-differential control (PID control), as appropriate.

The magnetic pole position calculator 70*d* calculates the magnetic pole angle (the magnetic pole position) of the rotor on the basis of a received magnetic pole position detection signal.

The energizing mode setter 70*e* sets the energizing mode on the basis of the magnetic pole angle of the rotor calculated by the magnetic pole position calculator 70*d*.

The energizing mode indicates the selective patterns of two phases to be energized among the coils of the three phases, namely, the U-phase coil 10*u*, the V-phase coil 10*v* and the W-phase coil 10*w* of the brushless motor 10. The energizing mode comes in six different types, namely, a first energizing mode in which current flows from the U-phase toward the V-phase, a second energizing mode in which current flows from the U-phase toward the W-phase, a third energizing mode in which current flows from the V-phase toward the W-phase, a fourth energizing mode in which current flows from the V-phase toward the U-phase, a fifth energizing mode in which current flows from the W-phase toward the U-phase, and a sixth energizing mode in which current flows from the W-phase toward the V-phase.

The gate control signal generator 70*f* is configured to generate the gate control signals for the switching elements 32*u*, 32*v*, 32*w*, 34*u*, 34*v* and 34*w* on the basis of the duty calculated by the duty calculator 70*c* and the energizing mode set by the energizing mode setter 70*e* or an instruction from the failure diagnoser 70*h*, and to output the generated gate control signals to the switching elements 32*u*, 32*v*, 32*w*, 34*u*, 34*v* and 34*w*.

The virtual neutral point voltage calculator 70*g* performs the A/D conversion on the detection signals of the voltage of the virtual neutral point N of the voltage detection circuit 60 to calculate the voltage in a digital value.

The failure diagnoser 70*h* carries out failure diagnosis processing for diagnosing whether a failure has occurred in the inverter 30 on the basis of the voltage of the virtual neutral point N calculated by the virtual neutral point voltage calculator 70*g*. The failure diagnosis processing is composed primarily of a first diagnosis, a second diagnosis, and a third diagnosis.

The switch setter 70*i* is configured to switch the on/off settings of the first switch SW1, the second switch SW2 and the third switch SW3 between the normal operation mode in which the failure diagnosis of the inverter 30 is not performed and a failure diagnosis mode in which the failure diagnosis processing is performed on the inverter 30 according to an instruction from the failure diagnoser 70*h*.

Figure 3:
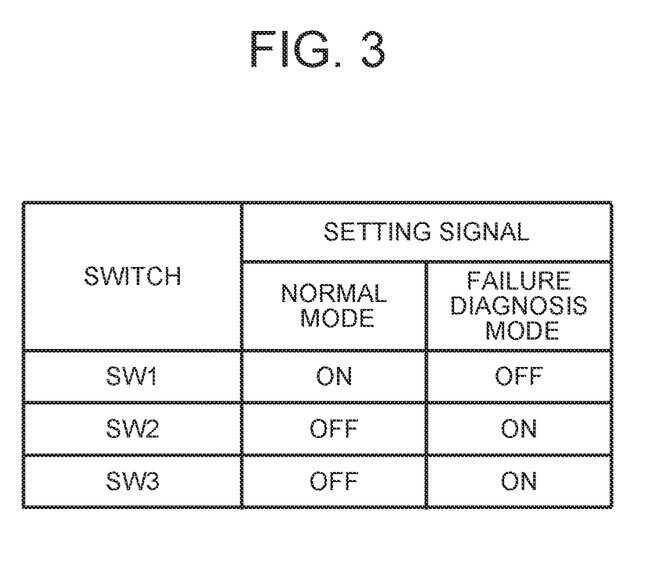
FIG. 3 is a list illustrating switch setting in the drive controller illustrated in FIG. 1.

To be specific, as illustrated in FIG. 3, the switch setter 70*i* is configured to output a setting signal to turn on the first switch SW1 and turn off the second switch SW2 and the third switch SW3 in the normal operation mode, in which the failure diagnosis is not performed on the inverter 30 (refer to SW1, SW2 and SW3 in FIG. 1). Thus, in the normal operation mode, current flows from the power source 80 to the inverter 30 through the positive bus 24*p* and the control of the drive of the brushless motor 10 is not impeded. Meanwhile, the switch setter 70*i* is configured to output a setting signal to turn off the first switch SW1 and turn on the second switch SW2 and the third switch SW3 in the failure diagnosis mode, in which the failure diagnosis processing is performed on the inverter 30.

The failure diagnosis device for the inverter 30 is composed of the voltage detection circuit 60, the control unit 70, the first switch SW1, the second switch SW2, the third resistor R3 connected in series with the second switch SW2, the third switch SW3, and the fourth resistor R4 connected in series with the third switch SW3. All or part of sections relating to the failure diagnosis device for the inverter 30 of the control unit 70 may be embodied by the CPU, which reads a program stored in the ROM into the RAM and executes the program.

Figure 4:
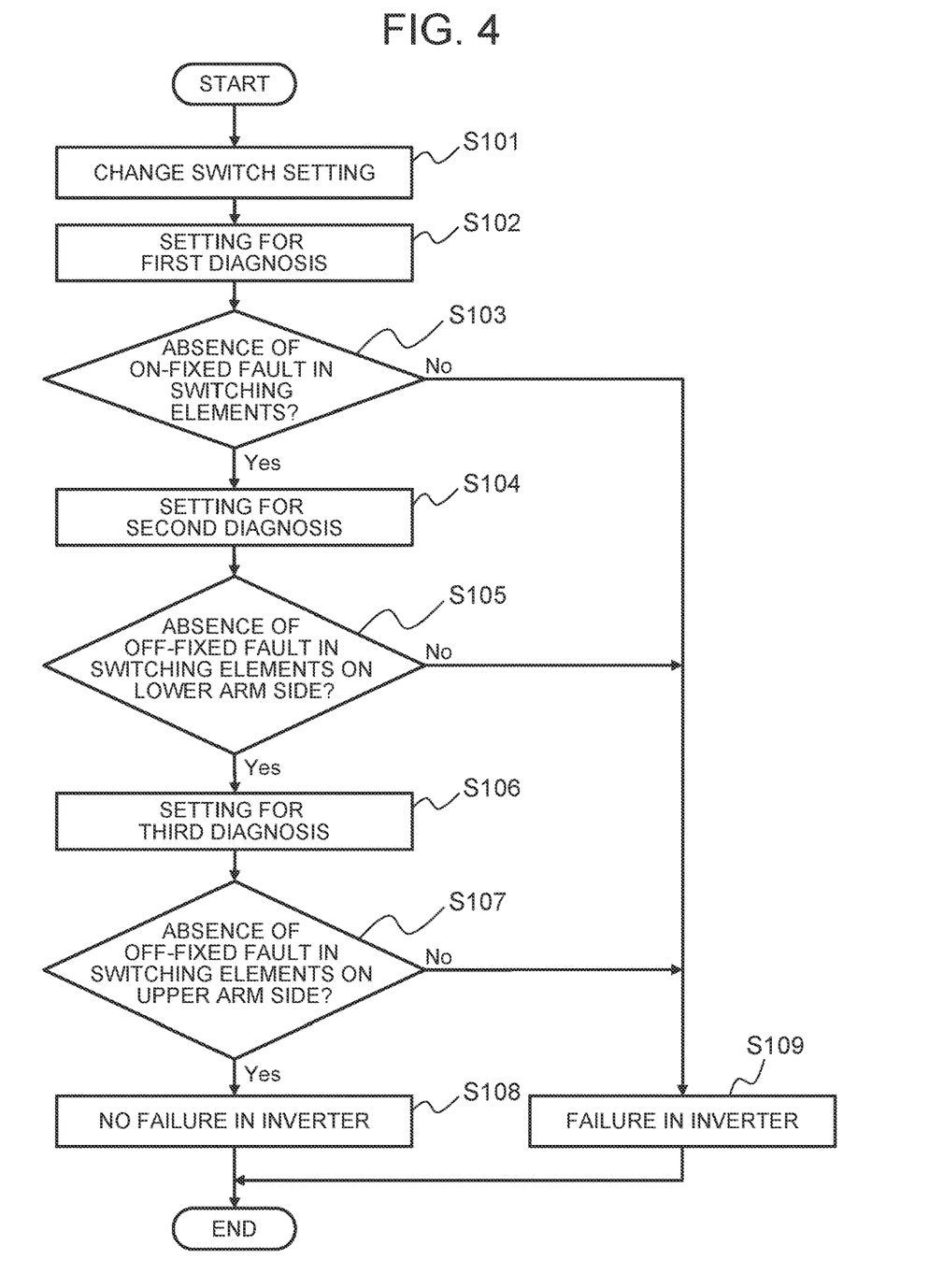
FIG. 4 is a flowchart illustrating the inverter failure diagnosis processing in the control unit of the drive controller illustrated in FIG. 1.

FIG. 4 is a flowchart illustrating the failure diagnosis processing performed on the inverter 30, which is performed in the control unit 70 as necessary according to the operating condition of a vehicle when an ignition key is turned on.

In step 101 (abbreviated as "S101" in the flowchart, which will be applied hereinafter), the on/off setting of the first switch SW1, the second switch SW2 and the third switch SW3 is changed to carry out the failure diagnosis processing on the inverter 30. More specifically, for example, the failure diagnoser 70h detects that the state of the ignition key has been switched from OFF to ON and instructs the switch setter 70i to change to the switch setting for the failure diagnosis mode. Thus, the switch setter 70i outputs a setting signal for turning the first switch SW1 off and turning the second switch SW2 and the third switch SW3 on, as illustrated in FIG. 3.

In step 102, the on/off setting of the switching elements 32u, 32v, 32w, 34u, 34v and 34w is performed to carry out the first diagnosis (the first diagnosis setting).

The first diagnosis is performed to diagnose whether the ON-fixed fault has occurred in any one of the switching elements 32u, 32v, 32w, 34u, 34v and 34w, i.e. whether the switching elements 32u, 32v, 32w, 34u, 34v and 34w properly turn off.

Figure 5:
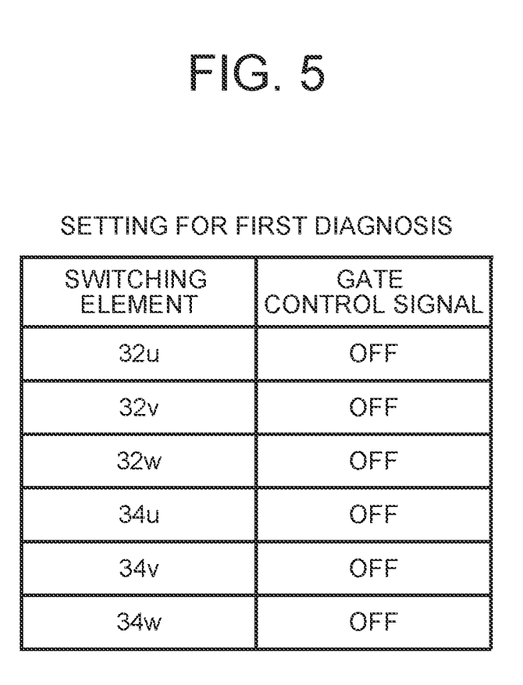
FIG. 5 is a list illustrating the on/off setting of switching elements for a first diagnosis in the inverter failure diagnosis processing in FIG. 4.

Therefore, the setting for the first diagnosis turns off all the gate control signals to the switching elements 32u, 32v, 32w, 34u, 34v and 34w, as illustrated in FIG. 5. For example, even if the duty has been calculated by the duty calculator 70c and the energizing mode has been set by the energizing mode setter 70e, the failure diagnoser 70h instructs the gate control signal generator 70f to forcibly turn off all the gate control signals to the switching elements 32u, 32v, 32w, 34u, 34v and 34w.

Then, under the setting for the first diagnosis, a voltage value Vn of the virtual neutral point N calculated by the virtual neutral point voltage calculator 70g is stored in a writable memory, such as a RAM.

In step 103, it is diagnosed whether the ON-fixed fault has occurred in any one of the switching elements 32u, 32v, 32w, 34u, 34v and 34w.

More specifically, under the setting for the first diagnosis, the failure diagnoser 70h diagnoses whether the ON-fixed fault has occurred on the basis of a result of the comparison between the voltage value Vn of the virtual neutral point N calculated by the virtual neutral point voltage calculator 70g and stored and a threshold value stored beforehand in a memory, such as a ROM.

Under the setting for the first diagnosis in the failure diagnosis processing, if the ON-fixed fault has not occurred in any of the switching elements 32u, 32v, 32w, 34u, 34v and 34w, then no current flows to the inverter 30 and the second resistor R2 through the second switch SW2 and the third resistor R3. Hence, current flows to the second resistor R2, passing through the third switch SW3 and then the fourth resistor R4. Therefore, if the resistance values of the fourth resistor R4 and the second resistor R2 are denoted by R4 and R2, respectively, then the voltage value Vn of the virtual neutral point N is expected to fall within a predetermined range D obtained by adding an error ($\pm\alpha$), such as variations in the resistance values R2 and R4, to a voltage division value $V_{R2-R4}$ {=Vcc×R2/(R2+R4)} obtained by dividing the voltage Vcc of the power source 80.

However, if it is found that the ON-fixed fault has occurred in one of the switching elements 32u, 32v and 32w on the upper arm side under the setting for the first diagnosis in the failure diagnosis processing, then current flows into the second resistor R2 through the second switch SW2 in addition to the third switch SW3, so that the voltage value Vn of the virtual neutral point N increases. Meanwhile, if it is found that the ON-fixed fault has occurred in one of the switching elements 34u, 34v and 34w on the lower arm side, then the current that has passed through the fourth resistor R4 via the third switch SW3 flows toward the ground not only via the second resistor R2 but also via the first resistor R1, any one of the switching elements 34u, 34v and 34w that has incurred the ON-fixed fault, and the current sensor 40. This causes a reduction in the current flowing into the second resistor R2, so that the voltage value Vn of the virtual neutral point N decreases.

Accordingly, in step 103, if it is found that the voltage value Vn of the virtual neutral point N that has actually been detected and calculated falls within the predetermined range D, that is, if $V_{R2-R4}-\alpha \leq Vn \leq V_{R2-R4}+\alpha$ applies, then it can be diagnosed that the ON-fixed fault has not occurred in any one of the switching elements 32u, 32v, 32w, 34u, 34v and 34w, so that the processing proceeds to step 104 (Yes) to diagnose the occurrence of an OFF-fixed fault. Meanwhile, if the voltage value Vn of the virtual neutral point N does not fall within the predetermined range D, then it can be diagnosed that the ON-fixed fault has occurred in one of the switching elements 32u, 32v, 32w, 34u, 34v and 34w, so that the processing proceeds to step 109 (No) to diagnose that a failure has occurred in the inverter 30, and the failure diagnosis processing is terminated. For example, if $Vn > V_{R2-R4}+\alpha$ applies, then it can be diagnosed that the ON-fixed fault has occurred in one of the switching elements 32u, 32v and 32w on the upper arm side. Meanwhile, if $Vn < V_{R2-R4}-\alpha$ applies, then it can be diagnosed that the ON-fixed fault has occurred in one of the switching elements 34u, 34v and 34w on the lower arm side. Thus, the occurrence of the ON-fixed fault can be diagnosed, distinguishing between the upper and the lower arms.

In the failure diagnosis processing, if it is assumed that the ON-fixed fault has occurred in the switching elements 32u, 32v, 32w, 34u, 34v and 34w on both the upper and the lower arm sides and a voltage is applied to the inverter 30 through the positive bus 24p from the first switch SW1, then there has conventionally been a possibility of the upper and the lower arms becoming short-circuited, causing the passage of an excessive current between the power source 80 and the ground through the inverter 30.

In contrast to the conventional failure diagnosis processing, according to the failure diagnosis processing in the present embodiment, current is supplied to the inverter 30 through the third resistor R3. Therefore, even if the ON-fixed fault has occurred in both the upper and the lower arms of the switching elements 32u, 32v, 32w, 34u, 34v and 34w, the voltage to be applied to the inverter 30 can be appropriately decreased by the third resistor R3. This makes it possible to carry out the failure diagnosis processing on the inverter 30 while suppressing the occurrence of the excessive short-circuit current between the power source 80 and the ground.

Further, in the failure diagnosis processing according to the present embodiment, if the ON-fixed fault has occurred in both the upper and the lower arms of the switching elements 32u, 32v, 32w, 34u, 34v and 34w, then the voltage value Vn of the virtual neutral point N may happen to be included in the first predetermined range D. For this reason, the actual current value calculated by the current calculator 70a may be monitored in the failure diagnoser 70h thereby to diagnose whether the ON-fixed fault has occurred in both the upper and the lower arms (refer to the dashed arrow in FIG. 2).

In step 104, the on/off setting for the switching elements 32u, 32v, 32w, 34u, 34v and 34w is performed to carry out the second diagnosis (the setting for the second diagnosis).

The second diagnosis is carried out on the assumption that the diagnosis result of the first diagnosis has proven that the switching elements 32u, 32v, 32w, 34u, 34v and 34w properly turn off, and is designed to diagnose whether the OFF-fixed fault has occurred in the switching elements 34u, 34v and 34w on the lower arm side, i.e. whether the switching elements 34u, 34v and 34w on the lower arm side properly turn on.

Figure 6:
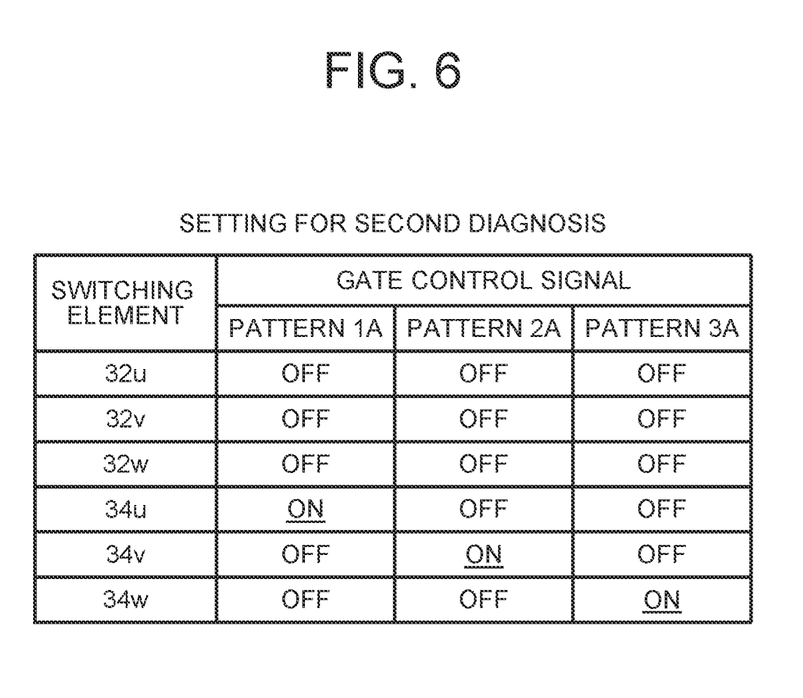
FIG. 6 is a list illustrating the on/off setting of switching elements for a second diagnosis in the inverter failure diagnosis processing in FIG. 4.

Hence, in the setting for the second diagnosis, as illustrated in FIG. 6, a pattern 1A in which only the gate control signal for the switching element 34u on the lower arm side is turned on, a pattern 2A in which only the gate control signal for the switching element 34v on the lower arm side is turned on, and a pattern 3A in which only the gate control signal for the switching element 34w on the lower arm side is turned on are implemented in any order in a state wherein the gate control signals for the switching elements 32u, 32v and 32w on the upper arm have been all forcibly turned off. For example, even if the duty has been calculated by the duty calculator 70c and the energizing mode has been set by the energizing mode setter 70e, the failure diagnoser 70h instructs the gate control signal generator 70f to sequentially output the gate control signals for the pattern 1A, a pattern 1B and a pattern 1C. Then, on each pattern of the setting for the second diagnosis, each voltage value Vn of the virtual neutral point N calculated by the virtual neutral point voltage calculator 70g is sequentially stored in a writable memory, such as a RAM.

In step 105, it is diagnosed whether the OFF-fixed fault has occurred in the switching elements 34u, 34v and 34w on the lower arm side.

More specifically, the failure diagnoser 70h diagnoses whether the OFF-fixed fault has occurred in the switching elements 34u, 34v and 34w on the lower arm side on the basis of a result of the comparison between the voltage values Vn of the virtual neutral point N, which have been stored when the pattern 1A, the pattern 2A and the pattern 3A are implemented, and threshold values stored beforehand in a memory, such as a ROM.

It has been confirmed by the diagnosis result of the first diagnosis that the switching elements 32u, 32v, 32w, 34u, 34v and 34w properly turn off. Hence, under the setting for the second diagnosis in the failure diagnosis processing, if the OFF-fixed fault has occurred in the switching elements 34u, 34v and 34w on the lower arm side, then the current that has passed through the fourth resistor R4 from the third switch SW3 flows to the ground through the second resistor R2 rather than flowing to the inverter 30. Therefore, the voltage value Vn of the virtual neutral point N is expected to fall within a predetermined range D obtained by adding an error (±α), such as variations in the resistance values R2 and R4, to the foregoing voltage division value $V_{R2\_R4}$ {=Vcc× R2/(R2+R4)}. Meanwhile, if the OFF-fixed fault has not occurred in the switching elements 34u, 34v and 34w on the lower arm side, then the current that has passed through the fourth resistor R4 via the third switch SW3 not only flows toward the ground through the second resistor R2 but also flows toward the ground through the fourth resistor R4, the first resistor R1, any one of the switching elements 34u, 34v and 34w on the lower arm side that has been turned on, and the current sensor 40. Accordingly, the voltage value Vn at the virtual neutral point N will be a voltage value that is less than the foregoing voltage division value $V_{R2\_R4}$ {=Vcc× R2/(R2+R4)} by the value corresponding to the current which has flowed to the ground through a different route from the second resistor R2.

Thus, in step 105, in the case where the voltage values Vn of the virtual neutral point N actually detected in the pattern 1A, the pattern 2A and the pattern 3A fall within the predetermined range D, that is, if $V_{R2\_R4}-\alpha \leq Vn \leq V_{R2\_R4}+\alpha$ applies, then it can be diagnosed that the OFF-fixed fault has occurred in the switching elements 34u, 34v and 34w on the lower arm side. In this case, the processing proceeds to step 109 (No) to diagnose that a failure has occurred in the inverter 30, and the failure diagnosis processing is terminated. Meanwhile, in the case where the voltage values Vn of the virtual neutral point N actually detected in the pattern 1A, the pattern 2A and the pattern 3A do not fall within the foregoing predetermined range D, that is, if $Vn<V_{R2\_R4}-\alpha$ applies, then it can be diagnosed that the OFF-fixed fault has not occurred in the switching elements 34u, 34v and 34w on the lower arm side. Hence, the processing subsequently proceeds to step 106 (Yes) to diagnose whether the OFF-fixed fault has occurred in the switching elements 32u, 32v and 32w on the upper arm side.

In step 106, the on/off setting for the switching elements 32u, 32v, 32w, 34u, 34v and 34w is performed to carry out the third diagnosis (the setting for the third diagnosis).

The third diagnosis is carried out on the assumption that the diagnosis result of the first diagnosis has proven that the switching elements 32u, 32v, 32w, 34u, 34v and 34w properly turn off, and is designed to diagnose whether the OFF-fixed fault has occurred in the switching elements 32u, 32v and 32w on the upper arm side, i.e. whether the switching elements 32u, 32v and 32w on the upper arm side properly turn on.

Figure 7:
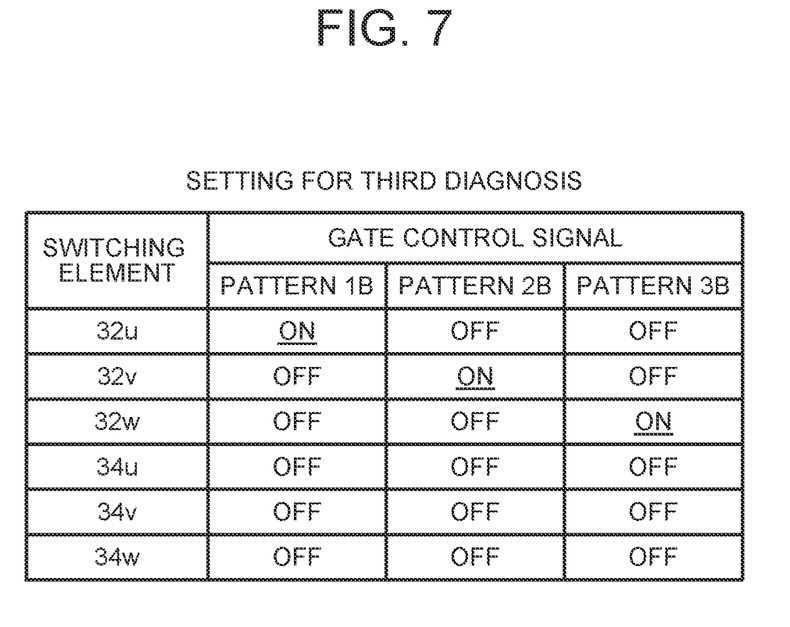
FIG. 7 is a list illustrating the on/off setting of switching elements for a third diagnosis in the inverter failure diagnosis processing in FIG. 4.

Hence, in the setting for the third diagnosis, as illustrated in FIG. 7, the pattern 1B in which only the gate control signal for the switching element 32u on the upper arm side is turned on, a pattern 2B in which only the gate control signal for the switching element 32v on the upper arm side is turned on, and a pattern 3B in which only the gate control signal for the switching element 32w on the upper arm side is turned on are implemented in any order in a state wherein the gate control signals for the switching elements 34u, 34v and 34w on the lower arm have been all forcibly turned off. For example, even if the duty has been calculated by the duty calculator 70c and the energizing mode has been set by the energizing mode setter 70e, the failure diagnoser 70h instructs the gate control signal generator 70f to sequentially output the gate control signals for the pattern 1A, the pattern 1B and the pattern 1C. Then, on each pattern of the setting for the third diagnosis, each voltage value Vn of the virtual neutral point N calculated by the virtual neutral point voltage calculator 70g is sequentially stored in a writable memory, such as a RAM.

In step 107, it is diagnosed whether the OFF-fixed fault has occurred in the switching elements 32u, 32v and 32w on the upper arm side.

More specifically, the failure diagnoser 70h diagnoses whether the OFF-fixed fault has occurred in the switching elements 32u, 32v and 32w on the upper arm side on the basis of a result of the comparison between the voltage values Vn of the virtual neutral point N, which have been stored when the pattern 1B, the pattern 2B and the pattern 3B are implemented, and threshold values stored beforehand in a memory, such as a ROM.

It has been confirmed by the diagnosis result of the first diagnosis that the switching elements 32u, 32v, 32w, 34u, 34v and 34w properly turn off. Hence, under the setting for the third diagnosis in the failure diagnosis processing, if the OFF-fixed fault has occurred in the switching elements 32u, 32v and 32w on the upper arm side, then the current does not flow to the second resistor R2, passing through the switching elements 32u, 32v and 32w on the upper arm side, whereas the current that has passed through the fourth resistor R4 from the third switch SW3 flows to the second resistor R2. Therefore, if the OFF-fixed fault has occurred in the switching elements 32u, 32v and 32w on the upper arm side, then the voltage value Vn of the virtual neutral point N is expected to fall within a predetermined range D obtained by adding an error (±α), such as variations in the resistance values R2 and R4, to the foregoing voltage division value $V_{R2-R4}$ {=Vcc×R2/(R2+R4)}. Meanwhile, if the OFF-fixed fault has not occurred in the switching elements 32u, 32v and 32w on the upper arm side, then two currents flow to the second resistor R2, one of the two currents flowing to the second resistor R2 from the second switch SW2, passing through any one of the switching elements 32u, 32v and 32w on the upper arm side that has been set to on, and the other current flowing to the second resistor R2 through the fourth resistor R4 from the third switch SW3. Accordingly, the voltage value Vn at the virtual neutral point N will be greater than the foregoing voltage division value $V_{R2-R4}$ {=Vcc×R2/(R2+R4)}.

Thus, in step 107, in the case where the voltage values Vn of the virtual neutral point N actually detected in the pattern 1B, the pattern 2B and the pattern 3B fall within the predetermined range D, that is, if $V_{R2-R4}-\alpha \leq Vn \leq V_{R2-R4}+\alpha$ applies, then it can be diagnosed that the OFF-fixed fault has occurred in the switching elements 32u, 32v and 32w on the upper arm side. In this case, the processing proceeds to step 109 (No) to diagnose that a failure has occurred in the inverter 30, and the failure diagnosis processing is terminated. Meanwhile, in the case where the voltage values Vn of the virtual neutral point N actually detected in the pattern 1B, the pattern 2B and the pattern 3B do not fall within the foregoing predetermined range D, that is, if $Vn > V_{R2-R4}+\alpha$ applies, then it can be diagnosed that the OFF-fixed fault has not occurred in the switching elements 32u, 32v and 32w on the upper arm side. Hence, the processing proceeds to step 108 (Yes) to comprehensively diagnose that no failure has occurred in the inverter 30 on the basis of the diagnosis results of the first diagnosis, the second diagnosis, and the third diagnosis, and terminates the failure diagnosis processing.

As described above, according to the failure diagnosis device and the failure diagnosis method for the inverter 30, current is supplied from the second switch SW2 to the inverter 30 through the third resistor R3 rather than supplying the current from the first switch SW1 to the inverter 30 through the positive bus 24p in the failure diagnosis processing. Thus, even if the ON-fixed fault occurs in both the upper and the lower arms, causing the short-circuit current to be generated between the power source 80 and the ground through the second switch SW2, the voltage applied to the inverter 30 can be decreased through the third resistor R3 to a level that allows a second failure due to the overheating of the inverter 30 to be suppressed. Hence, the failure diagnosis device and the failure diagnosis method for the inverter 30 in accordance with the present embodiment make it possible to carry out the failure diagnosis processing on the inverter 30 while suppressing the occurrence of the excessive short-circuit current between the power source 80 and the ground through the inverter 30.

Further, according to the failure diagnosis device and the failure diagnosis method for the inverter 30, since the absence of the ON-fixed fault in the switching elements has been confirmed in the first diagnosis, there will be no case where the switching elements 32u, 32v and 32w on the upper arm side and the switching elements 34u, 34v and 34w on the lower arm side are turned on in the second diagnosis and the third diagnosis, thus making it possible to carry out the failure diagnosis processing on the inverter 30 while suppressing the occurrence of the excessive short-circuit current between the power source 80 and the ground through the inverter 30.

In the second diagnosis and the third diagnosis according to the foregoing embodiment, it has been diagnosed whether the OFF-fixed fault is present in the switching elements 32u, 32v, 32w, 34u, 34v and 34w on the basis of the comparison between the voltage value Vn of the virtual neutral point N stored under each pattern and the threshold value stored beforehand in a memory, such as a ROM. Alternatively, however, the step 105 and the step 107 can be modified as described below. In the step 105, if the voltage value Vn of the virtual neutral point N stored under each pattern of the setting for the second diagnosis hardly changes in comparison with the voltage value Vn of the virtual neutral point N stored in the setting for the first diagnosis, then it may be diagnosed that the OFF-fixed fault has occurred in the switching elements 34u 34v and 34w on the lower arm side. If, on the other hand, such a change is observed, then it may be diagnosed that the OFF-fixed fault is absent in the switching elements 34u, 34v and 34w on the lower arm side. Further, in the step 107, if the voltage value Vn of the virtual neutral point N stored under each pattern of the setting for the third diagnosis hardly changes in comparison with the voltage value Vn of the virtual neutral point N stored in the setting for the first diagnosis, then it may be diagnosed that the OFF-fixed fault is present in the switching elements 32u 32v and 32w on the upper arm side. If, on the other hand, such a change is observed, then it may be diagnosed that the OFF-fixed fault is absent in the switching elements 32u, 32v and 32w on the upper arm side.

In the foregoing embodiment, the failure diagnosis processing has been carried out in the order of the first diagnosis, the second diagnosis, and the third diagnosis: however, the order is not limited thereto. The orders of the second diagnosis and the third diagnosis may be switched, so that the failure diagnosis processing is carried out in the order of the first diagnosis, the third diagnosis and the second diagnosis.

In the foregoing embodiment, the failure diagnosis processing has been carried out with the inverter 30 electrically connected to the brushless motor 10 through the intermediary of the terminals 22u, 22v and 22w. However, the voltage value Vn of the virtual neutral point N estimated in the case where the absence of the ON-fixed fault is found in the first diagnosis, the voltage value Vn of the virtual neutral point N estimated in the case where the presence of the OFF-fixed fault in the lower arm is found in the second diagnosis, and the voltage value Vn of the virtual neutral point N estimated in the case where the presence of the OFF-fixed fault in the upper arm is found in the third diagnosis hardly change whether the inverter 30 and the brushless motor 10 are connected or not. This allows the failure diagnosis processing to be carried out in a state in which the brushless motor 10 is electrically isolated from the inverter 30.

In the foregoing embodiment, it has been described that the failure diagnosis processing is carried out, as appropriate, according to the operating condition of a vehicle at the timing when an ignition key is turned such that the operation of an in-vehicle electric brake is not interfered with. However, the failure diagnosis processing can be carried out at various timings according to an in-vehicle system to which the brushless motor 10 is applied. In the case where the brushless motor 10 is applied as the drive source of an electric water pump, the failure diagnosis processing may be carried out when there is no request for the operation of the electric water pump, for example, on the grounds that the temperature of the cooling water of an engine is lower than a desired value. Further, in the case where the brushless motor 10 and the inverter 30 are electrically isolated from each other, the failure diagnosis processing may be carried out at any timing without considering an in-vehicle system to which the brushless motor 10 is applied.

In the foregoing embodiment, the magnetic pole position of the rotor has been detected by the magnetic pole position detection sensor 50. Alternatively, however, sensor-less drive can be performed without using the magnetic pole position detection sensor 50 according to an in-vehicle system to which the brushless motor 10 is applied. For example, in the case where the brushless motor 10 is applied as the drive source of an electric water pump, the instant the voltage value Vn of the virtual neutral point N detected from the voltage detection circuit 60 and then calculated reaches zero volts may be established as the timing at which the energizing mode is switched.

The entire contents of Japanese Patent Application No. 2015-045096 filed on Mar. 6, 2015, on which priority is claimed, are incorporated herein by reference.

While only a select embodiment has been chosen to illustrate and describe the present invention, it will be apparent to those skilled in the art from this disclosure that various changes and modifications can be made herein without departing from the scope of the invention as defined in the appended claims.

Furthermore, the foregoing description of the embodiment according to the present invention is provided for illustration only, and it is not for the purpose of limiting the invention, the invention as claimed in the appended claims and their equivalents.

What is claimed is:

1. A failure diagnosis device for an inverter adapted to diagnose whether a failure has occurred in an inverter in which a pair of switching elements connected in series comprises upper and lower arms in each phase to drive a three-phase motor, the failure diagnosis device comprising:
   a voltage detection circuit in which a connection point interconnecting one end of each of three first resistors is connected to a ground through a second resistor, and another end of each of the three first resistors is connected in a one-to-one manner between the upper arm and the lower arm of each phase so as to detect a voltage of the connection point;
   a first switch provided on a positive bus which connects a power source and the switching elements on an upper arm side;
   a second switch provided in parallel with the first switch and in series with a third resistor;
   a third switch provided in series with a fourth resistor between the power source and the connection point; and
   a control unit which is configured to control turning on/off of the switching elements on the upper arm side, the switching elements on a lower arm side, the first switch, the second switch, and the third switch, and which is electrically connected to the connection point,
   wherein the control unit is configured to diagnose whether a failure has occurred in the inverter on the basis of the voltage of the connection point, the voltage being detected from the voltage detection circuit,
   wherein the control unit is configured to perform control so as to turn on the second switch and the third switch and turn off the first switch at a time of diagnosing whether a failure has occurred in the inverter,
   wherein the control unit is configured to diagnose whether an ON-fixed fault has occurred in the switching elements on the upper arm side and the switching elements on the lower arm side on the basis of the voltage of the connection point, the voltage of the connection point being detected in the case where control for turning off all the switching elements on the upper arm side and the switching elements on the lower arm side is performed, and
   wherein, in the case where it is diagnosed that the ON-fixed fault has not occurred in the switching elements on the upper arm side and the switching elements on the lower arm side, the control unit diagnoses whether an OFF-fixed fault has occurred in the switching elements on the lower arm side on the basis of the voltage of the connection point, the voltage of the connection point being detected in the case where control for turning off all the switching elements on the upper arm side is performed and control for turning on the switching elements on the lower arm side one by one in order is performed.

2. The failure diagnosis device for an inverter according to claim 1,
   wherein, in the case where it is diagnosed that the OFF-fixed fault has not occurred in the switching elements on the lower arm side, the control unit diagnoses whether the OFF-fixed fault has occurred in the switching elements on the upper arm side on the basis of the voltage of the connection point, the voltage of the connection point being detected in the case where control for turning off all the switching elements on the lower arm side is performed and control for turning on the switching elements on the upper arm side one by one in order is performed.

3. The failure diagnosis device for an inverter according to claim 1,
   wherein a negative bus which connects the ground and the switching elements on the lower arm side is further provided with a current sensor structured to detect current flowing to the three-phase motor.

4. The failure diagnosis device for an inverter according to claim 3,
   wherein the control unit is configured to further diagnose whether a failure has occurred in the inverter on the basis of a current detected by the current sensor.

5. A failure diagnosis device for an inverter adapted to diagnose whether a failure has occurred in an inverter in which a pair of switching elements connected in series comprises upper and lower arms in each phase to drive a three-phase motor, the failure diagnosis device comprising:
   a voltage detection circuit in which a connection point interconnecting one end of each of three first resistors is connected to a ground through a second resistor, and another end of each of the three first resistors is connected in a one-to-one manner between the upper arm and the lower arm of each phase so as to detect a voltage of the connection point;
   a first switch provided on a positive bus which connects a power source and the switching elements on an upper arm side;
   a second switch provided in parallel with the first switch and in series with a third resistor;
   a third switch provided in series with a fourth resistor between the power source and the connection point; and
   a control unit which is configured to control turning on/off of the switching elements on the upper arm side, the switching elements on a lower arm side, the first switch, the second switch, and the third switch, and which is electrically connected to the connection point, wherein the control unit is configured to diagnose whether a failure has occurred in the inverter on the basis of the voltage of the connection point, the voltage being detected from the voltage detection circuit, wherein the control unit is configured to perform control so as to turn on the second switch and the third switch and turn off the first switch at a time of diagnosing whether a failure has occurred in the inverter, wherein the control unit is configured to diagnose whether an ON-fixed fault has occurred in the switching elements on the upper arm side and the switching elements on the lower arm side on the basis of the voltage of the connection point, the voltage of the connection point being detected in the case where control for turning off all the switching elements on the upper arm side and the switching elements on the lower arm side is performed, and wherein, in the case where it is diagnosed that the ON-fixed fault has not occurred in the switching elements on the upper arm side and the switching elements on the lower arm side, the control unit diagnoses whether the OFF-fixed fault has occurred in the switching elements on the upper arm side on the basis of the voltage of the connection point, the voltage of the connection point being detected in the case where control for turning off all the switching elements on the lower arm side is performed and control for turning on the switching elements on the upper arm side one by one in order is performed.

6. The failure diagnosis device for an inverter according to claim 5, wherein, in the case where it is diagnosed that the OFF-fixed fault has not occurred in the switching elements on the upper arm side, the control unit diagnoses whether the OFF-fixed fault has occurred in the switching elements on the lower arm side on the basis of the voltage of the connection point, the voltage of the connection point being detected in the case where control for turning off all the switching elements on the upper arm side is performed and control for turning on the switching elements on the lower arm side one by one in order is performed.

7. A failure diagnosis method for an inverter adapted to diagnose whether a failure has occurred in an inverter in which a pair of switching elements connected in series comprises an upper arm and a lower arm in each phase to drive a three-phase motor, the method comprising:

receiving, by a control unit of the inverter, a voltage of a connection point from a circuit in which the connection point interconnecting one end of each of three of first resistors is connected to a ground through a second resistor and another end of each of the three first resistors is connected in a one-to-one manner between the upper arm and the lower arm of each phase;

diagnosing, by the control unit, whether the inverter has incurred a failure on the basis of the voltage of the connection point, the voltage being detected at a time of turning off a first switch provided on a positive bus connecting a power source and the switching elements on an upper arm side, turning on a second switch provided in parallel with the first switch and in series with a third resistor, turning on a third switch provided in series with a fourth resistor between the power source and the connection point, and performing control to turn on or off the switching elements on the upper arm side and the switching elements on a lower arm side according to a predetermined pattern, and diagnosing, by the control unit, whether an ON-fixed fault has occurred in the switching elements on the upper arm side and the switching elements on the lower arm side on the basis of the voltage of the connection point, the voltage of the connection point being detected in the case where control for turning off all the switching elements on the upper arm side and the switching elements on the lower arm side is performed, wherein, in the case where it is diagnosed that the ON-fixed fault has not occurred in the switching elements on the upper arm side and the switching elements on the lower arm side, diagnosing whether an OFF-fixed fault has occurred in the switching elements on the lower arm side on the basis of the voltage of the connection point, the voltage of the connection point being detected in the case where control for turning off all the switching elements on the upper arm side is performed and control for turning on the switching elements on the lower arm side one by one in order is performed.

8. A failure diagnosis method for an inverter adapted to diagnose whether a failure has occurred in an inverter in which a pair of switching elements connected in series comprises an upper arm and a lower arm in each phase to drive a three-phase motor, the method comprising:

receiving, by a control unit of the inverter, a voltage of a connection point from a circuit in which the connection point interconnecting one end of each of three of first resistors is connected to a ground through a second resistor and another end of each of the three first resistors is connected in a one-to-one manner between the upper arm and the lower arm of each phase;

diagnosing, by the control unit, whether the inverter has incurred a failure on the basis of the voltage of the connection point, the voltage being detected at a time of turning off a first switch provided on a positive bus connecting a power source and the switching elements on an upper arm side, turning on a second switch provided in parallel with the first switch and in series with a third resistor, turning on a third switch provided in series with a fourth resistor between the power source and the connection point, and performing control to turn on or off the switching elements on the upper arm side and the switching elements on a lower arm side according to a predetermined pattern; and diagnosing, by the control unit, whether an ON-fixed fault has occurred in the switching elements on the upper arm side and the switching elements on the lower arm side on the basis of the voltage of the connection point, the voltage of the connection point being detected in the case where control for turning off all the switching elements on the upper arm side and the switching elements on the lower arm side is performed, wherein, in the case where it is diagnosed that the ON-fixed fault has not occurred in the switching elements on the upper arm side and the switching elements on the lower arm side, diagnosing whether the OFF-fixed fault has occurred in the switching elements on the upper arm side on the basis of the voltage of the connection point, the voltage of the connection point being detected in the case where control for turning off all the switching elements on the lower arm side is performed and control for turning on the switching elements on the upper arm side one by one in order is performed.

* * * * *